United States Patent [19]

Todokoro et al.

[11] Patent Number: 4,774,460

[45] Date of Patent: Sep. 27, 1988

[54] STROBOSCOPIC TYPE POTENTIAL MEASUREMENT DEVICE

[75] Inventors: Hideo Todokoro, Tokyo; Osamu Yamada, Katsuta, both of Japan

[73] Assignee: Hitachi, Ltd., Tokyo, Japan

[21] Appl. No.: 8,253

[22] Filed: Jan. 29, 1987

[30] Foreign Application Priority Data

Jan. 29, 1986 [JP] Japan .................................. 61-15631

[51] Int. Cl.$^4$ ............................................ G01R 31/26
[52] U.S. Cl. ................................................ 324/158 R
[58] Field of Search ........................ 324/158 R, 158 D; 250/310, 311

[56] References Cited

U.S. PATENT DOCUMENTS

| | | | |
|---|---|---|---|
| 4,220,854 | 9/1980 | Feuerbaum | 324/158 R |
| 4,223,220 | 9/1980 | Feuerbaum | 324/158 R |
| 4,477,775 | 10/1984 | Fazekas | 324/158 R |
| 4,623,836 | 11/1986 | Frosien et al. | 324/158 R X |

OTHER PUBLICATIONS

Scanning Electron Microscopy/1983/II, Todokoro, H., et al. "Stroboscopic Scanning Electron Microscope . . . ", pp. 561-568.
IEEE Jour. of Solid-State Ckts., Feuerbaum, H., et al.. "Quantitative Measurement . . . ", vol. SC—13, No. 3, Jun. 1987, pp. 319-325.

Primary Examiner—Reinhard J. Eisenzopf
Assistant Examiner—Stephen M. Baker
Attorney, Agent, or Firm—Antonelli, Terry & Wands

[57] ABSTRACT

A stroboscopic type potential measurement device by which a sample is irradiated with a pulsed charged particle beam in synchronism with a periodical voltage in the sample and secondary electrons emitted by the sample irradiated with the pulsed charged particle beam are detected, while varying the phase of the pulsed charged particle beam with respect to that of the periodical voltage in the sample. At least one phase scanning cycle, forward and backward, is effected, by which the phase of the pulsed charged particle beam with respect to that of the periodical voltage is increased from 0° to 360° at a predetermined rate and thereafter descreased from 360° to 0° at substantially the same rate as the predeterming rate of increase. Outputs at each of the phases are subjected to an average processing so as to obtain one measurement result.

2 Claims, 5 Drawing Sheets

4,774,460

STROBOSCOPIC TYPE POTENTIAL MEASUREMENT DEVICE

BACKGROUND OF THE INVENTION

This invention relates to a potential measurement device by means of an electron beam and in particular to a stroboscopic type potential measurement device permitting to measure time variations of potential (potential waveform) on interconnection lines in LSI by using charged particles of a scanning electron microscope and so forth.

At first the principle of the stroboscopic type potential measurement device will be explained.

FIG. 1 is a scheme illustrating the fundamental construction of a stroboscopic type scanning electron microscope for measuring potential waveform by using a pulsed electron beam. An electron beam 2 emitted by an electron gun 1 is focused on a sample under test 10 by means of an electron lens 6 and swept by means of a deflector or scanning coil 8 in the same way as for the television display tube. When an electron beam collides against a solid body, reflected electrons or secondary electrons are produced. These are detected by a detector 9 and their image is displayed on a display device. This is the principle of the scanning electron microscope.

When a sample varying with a high speed is observed by means of this scanning electron microscope, the scanning with the electron beam swept by the deflector 8 cannot follow variations of the sample so that all the variations are displayed, superposed on each other. Consequently a pulse gate (combination of the deflector 3 and an aperture 4) is added, which chops the electron beam by means of a pulse generator synchronized with a driving device 11 giving the variations to the sample. By using such a construction the electron beam, with which the sample is scanned, can be controlled so that the sample is irradiated therewith only at a predetermined phase of the variations of the sample in order to detect the state of the sample only at the moment where the sample is irradiated. FIGS. 2A and 2B are schemes for explaining the above mentioned operation. The abscissa of FIG. 2A represents variations of the state of the sample, where the object is displaced between A and C, and the ordinate the time. Supposing that the phase (Timing), where the sample is irradiated with the electron beam, is a point of time a, the samples is observed on the display device 7, as indicated in FIG. 2B (a). Similarly, when the phase is points of time b and c in FIG. 2A, the sample is observed, as indicated in FIG. 2B (b) and (c), respectively. The phase, where the sample is observed, can be selected by means of a phase shifter 5 indicated in FIG. 1. In general, the phase shifter 5 is constituted by combinations of delay lines.

Principal applications of the stroboscopic type scanning electron microscope are observations of potential varying with a high speed in LSI. In this case an energy analyzer for secondary electrons is added between the detector 9 and the sample 10.

FIG. 3A illustrate this principle, in which a control electrode 13 is disposed between the sample under test 10 and the detector 9 opposed thereto. The control electrode 13 forms a potential barrier for discriminating energy of secondary electrons emitted by the sample 10 irradiated with the electron beam 2. FIG. 3B is a scheme for explaining the work of this potential barrier. In the case where no control electrode 13 is disposed over the sample, all the secondary electrons are detected by the detector 9. Energy of the secondary electrons emitted by the sample 10 of zero potential is distributed as indicated by A in FIG. 3B. When the potential of the sample 10 is $-5$ V, the distribution is changed as indicated by B. When the control electrode 13, to which $-5$ V is applied, is disposed, since detected secondary electrons are limited to those whose energy is higher than 5 eV, the amount of the detected secondary electrons varies, depending on the potential of the sample 10. Since the amount of the detected secondary electrons depends on the sample potential, inversely the potential of the sample 10 can be known from the amount of the detected secondary electrons.

However, by the potential measurement, for which only the control electrode 13 described above is disposed, the relationship between the potential of the sample 10 and the amount of the detected secondary electrons is not linear and therefore it is difficult to measure quantitatively the potential.

Consequently, in order to obtain a linear relationship therebetween, a feedback method is utilized, by which the potential of the control electrode is so regulated by means of an electronic circuit that the amount of the detected secondary electrons is kept always to be constant (cf IEEE, Journal of Solid State Circuits, vol. SC-13, No. 3, 1978).

FIG. 4 is a block diagram for explaining this feedback method. The output of the detector 9 is compared with a voltage of a reference voltage source 15 and the difference therebetween is amplified by an amplifier 14, the output of which is given to the control electrode 13. Since the feedback circuit is so constructed that, when the amount of the detected secondary electrons increases, the potential of the control electrode 13 decreases so that increase of the amount is suppressed, the amount of the detected secondary electrons is kept to be constant, however the potential of the sample 10 varies. In this way, since variations in the potential of the sample correspond one-to-one to variations in the potential of the sample 10, variations in unknown potential of the sample can be known quantitatively by measuring the potential of the control electrode 13.

When the phase of the phase shifter 5 indicated in FIG. 1 is varied slowly in a range from 0° to 360°, while measuring quantitatively the potential in the manner described above, a potential waveform corresponding to phase variations can be obtained. Regulation of the phase is effected by using a delay line, as stated previously. In this way, by using stroboscopic type scanning electron microscope, it is possible to measure potential waveforms as by a sampling oscilloscope.

By the method described above it is possible to measure potential waveforms by means of an electron beam. It has been already stated that principal applications of the stroboscopic type scanning electron microscope are measurements of potential waveforms in LSIs. However, in many cases, an LSI is covered with an insulation film called passivation for protecting semiconductor circuits formed therein against dirt and humidity. Since this passivation film lies between the electron beam and the metallic electrodes in the LSI, it acts equivalently as a capacitor. This interposition of the capacitor means that it is not possible to measure any stationary voltage (e.g. DC voltage). Consequently it is not possible to obtain any potential waveform by the method described above, by which the phase is regulated slowly. This aspect will be explained below, referring to FIGS. 5, 6A, 6B and 6C. FIG. 5 indicates a model representing the relation between the action of the capacitor formed by the passivation film and obtained signals. An electric current I 17 flows through a resistance 16 from an AC voltage source 21 through an electrostatic capacitance 20 formed between a spot irradiated with the electron beam and a conductor 19 in the LSI. The resistance 16 is an equivalent detection resistance. The amplitude of the output of a periodical voltage source 21 in this model is equal to the voltage in the LSI. However its frequency is not real frequency in the LSI, but the phase of the former is shifted by 360° with respect to that of the latter. In the case where the phase is fixed, a DC voltage is obtained. As it can be seen from this equivalent circuit, when the period for changing the phase is made as short as possible, original waveform (waveform to be measured in the LSI) can be measured. Therefore, the inventors of this invention have ameliorated this method usually utilized, by which the whole phase is scanned in 10-40 seconds, and realized a method, by which the whole phase is scanned in 10-40 ms and measured values thus obtained are superposed about 1000 times. (cf. Scanning Electron Microscopy, 1983, Vol. II, pp. 561-568) However, even by this method, when the passivation film is thick and conductors in the LSI are fine, difficulties are provoked. If it is tried to make the period for changing the phase still shorter, the division of the phase, i.e. the division in time becomes coarse and thus it becomes impossible to measure waveforms in detail.

In order to resolve this problem, one of the inventors of this invention has filed a U.S. patent application (Ser. No. 852,751), according to which measurements by coarse phase division and those by fine phase division are effected so that a voltage waveform close to the original waveform can be reproduced by combining results thus obtained.

However, the device disclosed in this application had a drawback that the scanning device and the circuits for reproducing voltage waveforms were complicated.

SUMMARY OF THE INVENTION

The object of this invention is to provide a stroboscopic type potential measurement device permitting to resolve the problem described above, to reproduce a waveform close to the original waveform and to measure the waveform in detail.

In order to achieve this object, a stroboscopic type potential measurement device according to this invention comprises charged particle beam irradiation means, which irradiates a sample with a charged particle beam pulsed in synchronism with a periodical voltage in the sample, phase shifter means, which varies the phase between the periodical voltage in the sample and the pulsed charged particle beam, and potential measurement means detecting secondary electrons emitted by the sample irradiated with the pulsed charged particle beam and measuring a waveform of a periodical voltage at a spot irradiated with the pulsed beam. The phase shifter means can effect at least one phase scanning cycle, forward and backward, by which the phase of the pulsed charged particle beam with respect to that of the periodical voltage is varied from a first value to a second value, preferably from 0° to 360° and thereafter from the second value to the first value, preferably from 360° to 0°. The potential measurement means is so constructed that the results thus obtained are subjected to an average processing and a measurement result is obtained.

DESCRIPTION OF THE PREFERRED EMBODIMENTS

Figure 1:
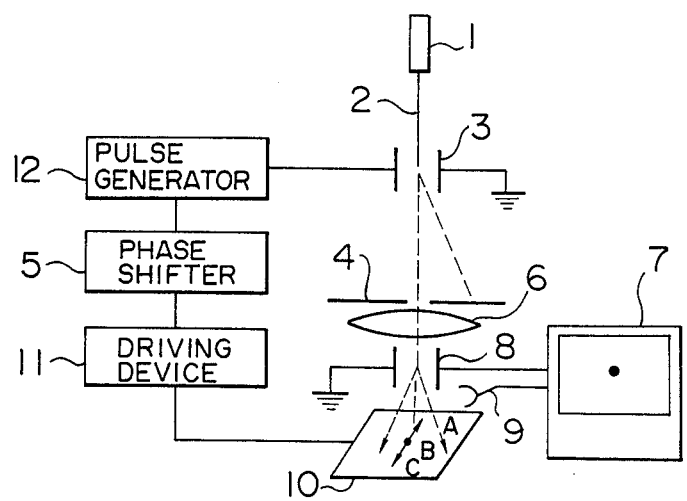
FIG. 1 is a scheme illustrating the construction of a stroboscopic type scanning electron microscope.
Figure 2A:
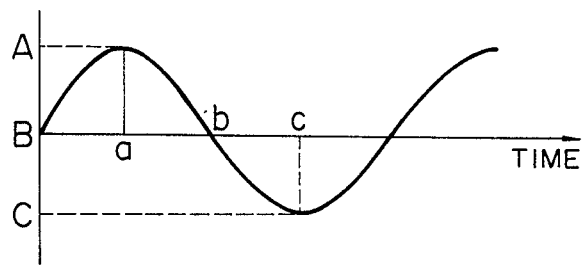
FIGS. 2A and 2B are schemes for explaining the work of the microscope indicated in FIG. 1, FIG. 2A being a waveform diagram indicating the relation between the location irradiated with the electron beam and the time, FIG. 2B indicating representations on a display device.
Figure 2B:
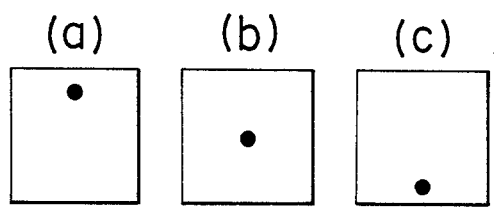
Figure 3A:
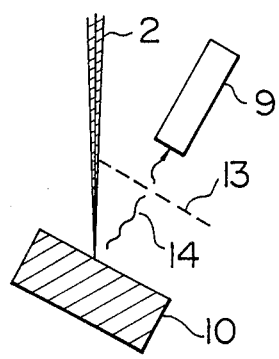
FIG. 3A is a scheme illustrating the construction of a potential measurement device by means of an electron beam.
Figure 3B:
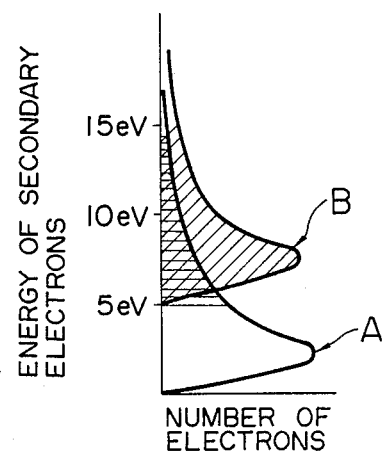
FIG. 3B indicates characteristic curves showing the relation between the number of electrons detected by the potential measurement device indicated in FIG. 3A and the energy of secondary electrons.
Figure 4:
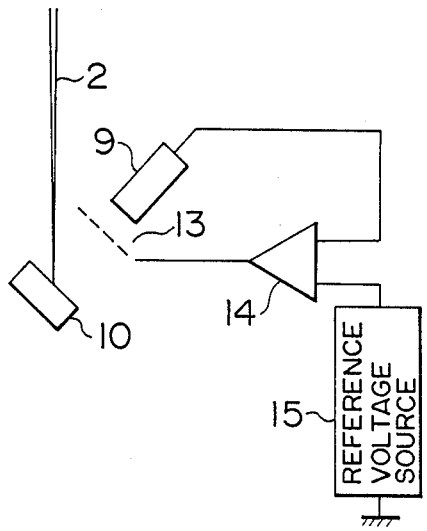
FIG. 4 is a scheme illustrating the construction of a potential measurement device for quantitative measurements of the potential.
Figure 5:
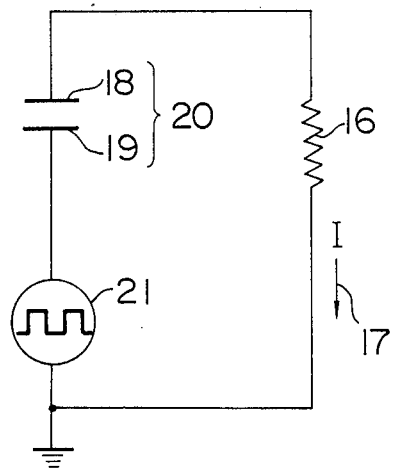
FIG. 5 is an equivalent circuit diagram of the device indicated in FIG. 4 in the case where an LSI is covered with a passivation film.
Figure 6A:
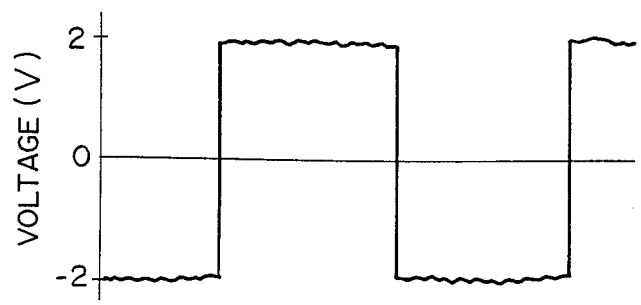
FIG. 6A indicates the original waveform to be measured.
Figure 6B:
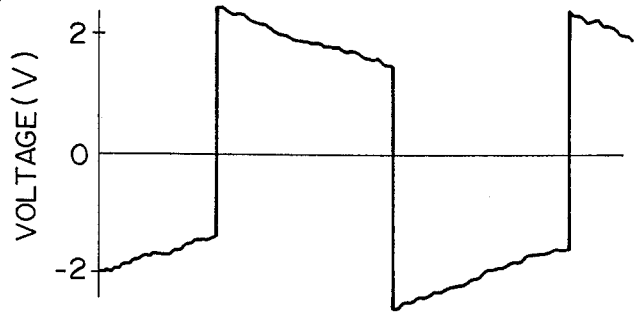
FIG. 6B indicates a waveform obtained by the prior art method.
Figure 6C:
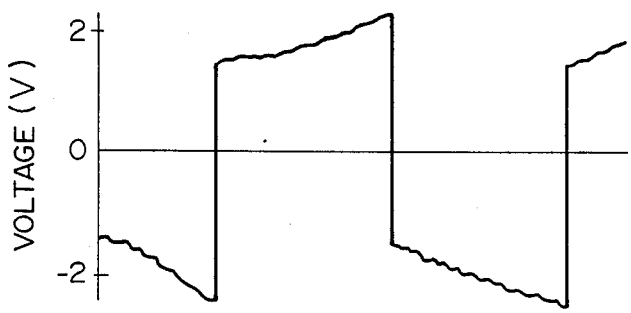
FIG. 6C indicates a waveform obtained by a scanning in the reverse direction.

At first the principle of this invention will be explained before explanation of the embodiments. FIG. 6A indicates the original waveform, which is supposed to be rectangular. When a phase scanning from 0° to 360° is effected therefor, the waveform indicated in FIG. 6B is obtained. To the contrary, when the phase scanning is effected from 360° to 0°, the waveform has a form as indicated in FIG. 6C. Since a direction of phase is different between the former and the latter, the former has a waveform whose the right side slopes down and the latter has a waveform whose the left side slopes down. This invention has been made while paying attention to this point.

Figure 6D:
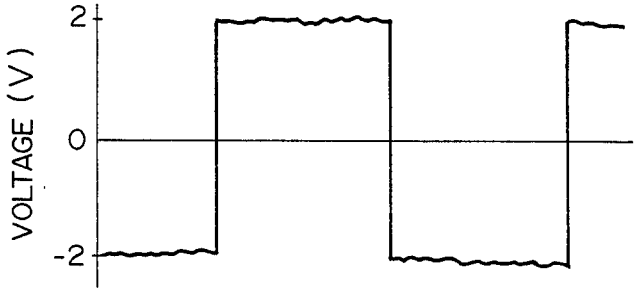
FIG. 6D indicates a waveform obtained by the method according to this invention.

Taking this fact into account, the waveform indicated in FIG. 6D can be obtained by adding the signal indicated in FIG. 6B and that indicated in FIG. 6C and dividing the sum thus obtained by 2. This is the principle of this invention.

Figure 7A:
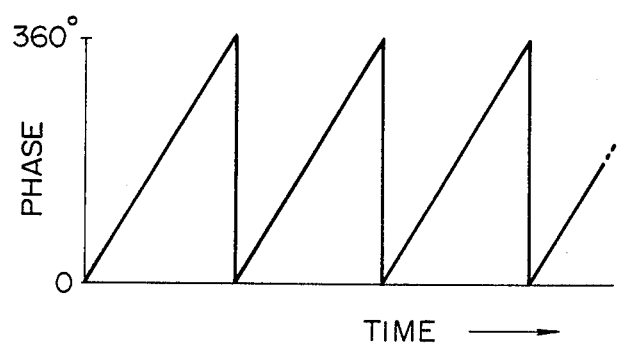
FIG. 7A is a scheme for explaining the phase scanning according to the prior art method.
Figure 7B:
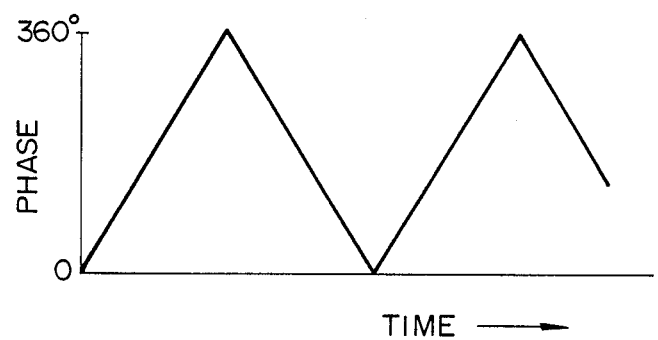
FIG. 7B is a scheme for explaining the phase scanning according to this invention.

FIG. 7 indicates the difference between the phase scanning according to the prior art techniques and that according to this invention, FIG. 7A showing the former and FIG. 7B the latter. According to the prior art techniques the phase is increased from 0° to 360° and returned to 0°, as soon as it reaches 360°. By repeating this process and adding the results thus obtained, their average value is outputted. According to this invention, the phase is not returned directly after it has reached 360°, but it is reduced gradually. That is, the phase scanning according to the prior art techniques was effected by using a sawtooth-shaped waveform and to the contrary, according to this invention a triangular waveform is used therefore. Although in the above explanation the phase scanning is effected between 0° and 360°, the same effect can be obtained, even if the phase scanning is effected only on a part of that region. Another advantage of this invention consists in that it is possible to make the frequency band of the feedback circuit narrower.

Figure 8:
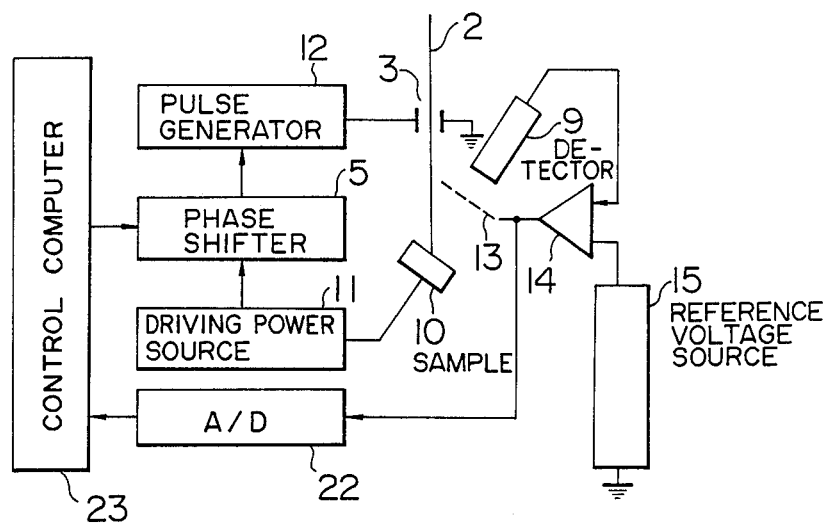
FIG. 8 is a scheme illustrating the construction of a stroboscopic type potential measurement device showing an embodiment of this invention.
Figure 9:
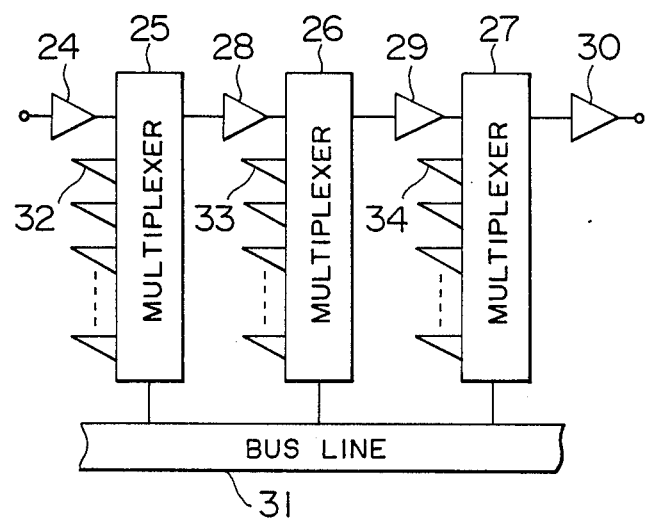
FIG. 9 is a circuit diagram showing an example of the delay circuit.

FIG. 8 represents an embodiment of this invention. In this embodiment the sample 10 is an LSI driven by a driving power source 11. The trigger output signal coming from the driving power source 11 is delayed (phaseregulated) by a phase shifter 5 controlled by a control computer 23 and inputted in a pulse generator 12 pulsating the electron beam. Secondary electrons emitted at the location irradiated with the electron beam in the sample 10 are detected through a control grid 13 by a detector 9. The control grid 13 is feedback-controlled by means of an amplifier 14 and a reference voltage source 15. The potential of the control grid 13, which is the output of the measurement is inputted through an A/D transformation circuit 22 in a control computer 23. The phase shifter 5 used for this embodiment is constructed as indicated in FIG. 9. The trigger output signal coming from the driving power source 11 is inputted in a buffer amplifier 24. After the buffer amplifier are connected 3 rows of multiplexers 25, 26, 27 one after another. Also between the multiplexers and at the output of the last multiplexer 27 are disposed buffer amplifiers 28, 29, 30. The multiplexers 25, 26, 27 are controlled by a 4-bit signal through a bus line 31 of the control computer 23. The first stage multiplexer 25 is provided with 15 delay lines of 0.1 ns, the middle stage multiplexer 26 with 15 delay lines 33 of 1.6 ns, and the last stage multiplexer with 15 delay lines 34 of 25.6 ns so that a delay of 409.5 ns in total can be obtained by combining them.

The work of the phase shifter 5 will be explained below by taking a measurement of a waveform, whose period is 102.4 ns, as an example. At first a delay of 102.3 ns at most is given with an interval of 0.1 ns. For example the gate of an A/D transformation circuit 26 is opened at a delay of 0 ns and data are taken in. Next data are similarly taken in with a delay of 0.1 ns. This procedure is repeated in the same way up to a delay of 102.3 ns.

Then the delay is reduced successively from 102.3 ns to 0 ns with an interval of 0.1 ns. This procedure is repeated e.g. 2048 times and the results thus obtained are averaged so as to obtain a waveform. When it is supposed that the data of one process are taken in in 10 $\mu$s this waveform measurement is terminated in 40 s.

As explained above, according to this invention, it is possible to resolve the problem of the distortion in waveform produced in the measurement for an LSI covered by a passivation film and a remarkable effect can be obtained for the development of LSIs.

What is claimed is:

1. A stroboscopic type potential measurement device comprising:

charged particle beam irradiation means, which irradiates a sample with a charged particle beam pulsed in synchronism with a periodical voltage in the sample;

phase shifter means, which varies the phase between the periodical voltage in the sample and the pulsed charged particle beam; and potential measurement means detecting secondary electrons emitted by the sample irradiated with the pulsed charged particle beam and measuring a waveform of a periodical voltage at a spot irradiated with the pulsed beam;

whereby said phase shifter means effects at least one phase scanning cycle, forward and backward, by which the phase of the pulsed charged particle beam with respect to that of the periodical voltage is increased from a first value to a second value at a predetermined rate of increase and thereafter decreased from the latter to the former at a rate of decrease substantially equal to the predetermined rate of increase, and said potential measurement means is so constructed that potentials measured at each of the phases of the pulsed charged particle beam are averaged so as to obtain one measurement result.

2. A stroboscopic type potential measurement device according to claim 1, in which the first value is 0° and the second value is 360°.

* * * * *